(12) United States Patent
Hashimoto

(10) Patent No.: US 8,178,968 B2
(45) Date of Patent: May 15, 2012

(54) ELECTRONIC COMPONENT

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 624 days.

(21) Appl. No.: 12/207,565

(22) Filed: Sep. 10, 2008

(65) Prior Publication Data

US 2009/0115054 A1    May 7, 2009

(30) Foreign Application Priority Data

Nov. 2, 2007  (JP) .................. 2007-286402

(51) Int. Cl.
*H01L 23/48*    (2006.01)
(52) U.S. Cl. .................... 257/737; 257/739; 257/741
(58) Field of Classification Search ............ 257/737, 257/739, 741
See application file for complete search history.

(56) References Cited

U.S. PATENT DOCUMENTS

| | | | |
|---|---|---|---|
| 5,477,087 A * | 12/1995 | Kawakita et al. | 257/737 |
| 5,877,556 A * | 3/1999 | Jeng et al. | 257/737 |
| 6,060,770 A * | 5/2000 | Nakamura et al. | 257/668 |
| 6,097,091 A * | 8/2000 | Ohsumi | 257/758 |
| 6,867,490 B2 * | 3/2005 | Toyosawa | 257/692 |
| 6,963,136 B2 | 11/2005 | Shinozaki et al. | |
| 7,432,585 B2 * | 10/2008 | Hashimoto | 257/679 |
| 7,547,971 B2 | 6/2009 | Shinozaki et al. | |
| 7,800,214 B2 * | 9/2010 | Yoshikawa et al. | 257/691 |
| 2001/0013651 A1 * | 8/2001 | Nakazawa | 257/737 |
| 2005/0230773 A1 * | 10/2005 | Saito et al. | 257/433 |
| 2007/0057370 A1 * | 3/2007 | Hashimoto | 257/737 |
| 2007/0109759 A1 * | 5/2007 | Torii et al. | 361/777 |
| 2008/0023830 A1 * | 1/2008 | Chang et al. | 257/737 |
| 2009/0219069 A1 | 9/2009 | Shinozaki et al. | |

FOREIGN PATENT DOCUMENTS

| | | |
|---|---|---|
| JP | 2002-043558 | 2/2002 |
| JP | 2004-031790 | 1/2004 |
| JP | 2005-109110 | 4/2005 |
| JP | 2005-310815 | 11/2005 |
| JP | 2005-340761 | 12/2005 |
| JP | 2007-081042 | 3/2007 |
| WO | 02-50898 | 6/2002 |

* cited by examiner

*Primary Examiner* — Jerome Jackson, Jr.
*Assistant Examiner* — David Spalla
(74) *Attorney, Agent, or Firm* — Harness, Dickey & Pierce, P.L.C.

(57) ABSTRACT

An electronic component includes: an active surface; a plurality of external connection terminals included in the active surface; a bump electrode disposed to the active surface, the bump electrode including: an internal resin formed on the active surface as a core; and a conductive film on a surface of the internal resin, the internal resin being formed in a nearly half-cylindrical shape having a transverse section of one of a nearly semicircular shape, a nearly semielliptical shape, and a nearly trapezoidal shape and extending orthogonal to the transverse section, the transverse section being orthogonal to the active surface; and a global wiring line disposed on the active surface and connecting between the plurality of external connection terminals, and at least one of the external connection terminals being electrically connected to the conductive film.

4 Claims, 7 Drawing Sheets

ELECTRONIC COMPONENT

BACKGROUND

1. Technical Field

The present invention relates to an electronic component.

2. Related Art

Techniques for mounting electronic components such as semiconductor ICs have been used for circuit substrates and liquid crystal displays that are mounted to various electronic apparatuses. For example, a liquid crystal driving IC chip to drive a liquid crystal panel is mounted to a liquid crystal display. The liquid crystal driving IC chip may often be directly mounted on a glass substrate included in a liquid crystal panel or mounted on a flexible substrate (FPC) mounted to the liquid crystal panel. The former mounting structure is called a chip on glass (COG) structure, and the latter is called a chip on FPC (COF) structure. Other than those mounting structures, a chip on board (COB) structure is also known in which IC chips are mounted on a glass epoxy board or the like.

In those mounting structures, a substrate having a terminal such as a land for being connected to a wiring pattern and an electronic component having a bump electrode for being electrically contacted are used. Refer to JP-A-2005-310815. The bump electrode disclosed in JP-A-2005-310815 has a semispherical shaped resin formed on an active surface of an electronic component as a core, and a conductive film provided on the surface of the resin. When the bump electrode is pressed to a land, the core is elastically deformed. This deformation can absorb thickness variations of the bump electrode and the land. In addition, the elastic restoring force (repelling force) of the deformation can press the conductive film on the core surface to the land. As a result, the land and the bump electrode can be adequately bonded.

It is conceivable that a core having a nearly half-cylindrical shape can enhance bonding (connecting) reliability. In general, an electronic component has external connection terminals one-dimensionally arranged in a peripheral area of its active surface. When the core having the nearly half-cylindrical shape is employed, the core is formed so as to extend in parallel with the arrangement of the external connection terminals and to have a section orthogonal to the extending direction of the core with a semicircular shape, for example. Conductive films are provided so that one of the conductive films extends from each external connection terminal in a direction orthogonal to the arrangement of the external connection terminals. The conductive films intersect the core at a plurality of places each corresponding to one of the external connection terminals. Each intersected portion can function as a contact area to the land. The shape of the contact area, when the bump electrode is pressed to the land, is a circular shape if the core has a semispherical shape whereas the shape is a rectangular shape if the core has a nearly half-cylindrical shape. Increasing the contact area between the bump electrode and the land can enhance the connecting reliability.

Employing a core having a nearly half-cylindrical shape, however, needs some improvement in order to downsize an electronic component or to make the electronic component have better electrical characteristics. In general, electrodes and electrode wiring lines of elements included in an electronic component are wired inside the electronic component and exposed on the active surface of the electronic component so as to serve as external connection terminals. The wiring lines inside the electronic component are very fine. Thus, wiring the fine wiring lines causes high wiring resistance, resulting in the electrical characteristics of the electronic component being lowered. In addition, it is necessary to secure spaces for wiring the wiring lines and for keeping the elements free from influences of an electrical field and capacitances due to wiring in use. These spaces hinder downsizing the electronic component and highly integrating the elements.

SUMMARY

An advantage of the invention is to provide an electronic component that is downsized and has improved electrical characteristics and highly integrated elements.

According to a first aspect of the invention, an electronic component includes: an active surface; a plurality of external connection terminals included in the active surface; a bump electrode disposed to the active surface, the bump electrode including: an internal resin formed on the active surface as a core; and a conductive film on a surface of the internal resin, the internal resin being formed in a nearly half-cylindrical shape having a transverse section of one of a nearly semicircular shape, a nearly semielliptical shape, and a nearly trapezoidal shape and extending orthogonal to the transverse section, the transverse section being orthogonal to the active surface; and a global wiring line disposed on the active surface and connecting the plurality of external connection terminals, and at least one of the external connection terminals is electrically connected to the conductive film.

In general, electrodes and electrode wiring lines of elements included in an electronic component are wired inside the electronic component and connected to external connection terminals on an active surface of the electronic component. The electronic component includes the global wiring line that is disposed on the active surface and electrically connects between the external connection terminals. This makes it possible to reduce wiring inside the electronic component. As a result, a degree of freedom in design can be increased.

According to a second aspect of the invention, an electronic component includes: an active surface; a plurality of external connection terminals included in the active surface; a plurality of bump electrodes disposed to the active surface, the plurality of bump electrodes including: internal resins formed on the active surface, each of the internal resins serving as a core; and conductive films on surfaces of the internal resins, each of the internal resins being formed in a nearly half-cylindrical shape having a transverse section of one of a nearly semicircular shape, a nearly semielliptical shape, and a nearly trapezoidal shape and extending orthogonal to the transverse section, the transverse section being orthogonal to the active surface, and at least one of the external connection terminals is electrically connected to a plurality of the conductive films.

With at least one of the external connection terminals electrically connected to the plurality of conductive films enables electronic signals to be transferred between the external connection terminal and a plurality of terminals provided to a substrate on which the electronic component is mounted through the bump electrodes. In other words, electrodes and electrode wiring lines of elements included in the electronic component can be provided as a re-wired wiring line on the surface (active surface) of the electronic component. Thus, wiring inside the electronic component to unify wiring lines or wiring of the substrate to divide wiring lines can be reduced. As a result, a degree of freedom in designing the electronic component and the substrate can be increased. For example, the electronic component can be downsized and the substrate can be provided with low costs.

In addition, reducing wiring inside the electronic component can also improve the electrical characteristics of the electronic component and the characteristics of a device including the electronic component. That is, wiring lines inside the electronic component is very fine because of downsizing of the electronic component and highly integration of the elements whereas wiring lines on the surface of the electronic component can be formed with thicker thickness by plating or the like. Thus, the wiring lines on the surface of the electronic component can have lower resistance and lower high-frequency loss than those of the wiring lines inside the electronic component. As a result, the electrical characteristics of the electronic component and the characteristics of the device including the electronic component can be improved. Since the external connection terminal is electrically connected to the conductive films, the connecting resistance between the bump electrodes and the terminal is lowered. As a result, the resistance loss and the high-frequency loss between the bump electrodes and the terminal can be reduced. In addition, the number of portions that can electrically make contact with the terminal increases, resulting in a high freedom in arranging a position at which the terminal is disposed.

According to a third aspect of the invention, an electronic component includes: an active surface; a plurality of external connection terminals included in the active surface; a plurality of bump electrodes disposed to the active surface, the plurality of bump electrodes including: internal resins formed on the active surface, each of the internal resins serving as a core; and conductive films on surfaces of the internal resins, each of the internal resins being formed in a nearly half-cylindrical shape having a transverse section of one of a nearly semicircular shape, a nearly semielliptical shape, and a nearly trapezoidal shape and extending orthogonal to the transverse section, the transverse section being orthogonal to the active surface, and at least one of the conductive films is electrically connected to a plurality of the external connection terminals.

In the device, one outer connection terminal is electrically connected to the bump electrode and another external connection electrode with wiring lines provided as a re-wired wiring line on the surface (active surface) of the electronic component. This also can reduce wiring inside the electronic component to divide wiring lines or wiring of the substrate to unify wiring lines. Accordingly, a degree of freedom in designing the electronic component and the substrate can be increased. As a result, the electronic component can be downsized and the characteristics of the electronic component and the characteristics of a device including the electronic component can be improved. Further, the number of bump electrodes can be reduced as compared with a case where the bump electrode is individually provided so as to correspond to each of the external connection terminals. That is, the number of connecting points between the bump electrode and the terminal of the substrate can be reduced. As a result, the electronic component can be downsized since downsizing the electronic component depends on the dimensions of connecting points.

In the electronic component of the third aspect, one of the bump electrodes may be disposed between a pair of the external connection terminals, the conductive film of the one of the bump electrodes extending to both the pair of the external connection terminals to electrically connect to the pair of the external connection terminals.

This structure can shorten a wiring path as compared with a case where the wiring line electrically connecting between the pair of external connection terminals is provided by bypassing the external resin of the bump electrode. As a result, the electronic component has good characteristics.

In the electronic component of the first aspect, the bump electrode disposed to the active surface may include a first bump electrode and a second bump electrode, and the internal resin may include a first internal resin and a second internal resin. The first bump electrode may have the first internal resin extending along a first direction and the second bump electrode may have the second internal resin extending along a second direction different from the first direction.

This structure gives a higher freedom in arranging a bump electrode position than that of a case where the internal resin extends along only one direction. Accordingly, a freedom in designing wiring lines between bump electrodes and between the bump electrode and the external connection terminal is increased. As a result, those wiring lines can function as a good re-wired wiring line.

In the electronic component of the first aspect, the conductive film of the bump electrode may extend to a side adjacent to one of the plurality of external connection terminals, and directly make contact with and electrically connect to the one of the external connection terminals, the one of the external connection terminals corresponding to the bump electrode. The conductive film of the bump electrode is preferably made of gold.

This structure allows the conductive film serving as the bump electrode and the external connection terminal to function as the wiring line between the bump electrode and the external connection terminal, resulting in no positioning shift between the conductive film of the bump electrode and the wiring line. In addition, forming processes are simplified since the conductive film of the bump electrode and the wiring line are integrally formed.

In general, wiring lines inside the electronic component are made of aluminum, copper or the like. As described above, the conductive film functions as a part of the wiring lines inside the electronic component. Thus, the conductive film made of gold can improve the electrical characteristics of the electronic component. In addition, the conductive film made of gold can follow the deformation of the internal resin when the electronic component is mounted since gold has good rolling property.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments of the invention are described below. The technical scope of the invention is not limited to the following embodiments. In the following descriptions, various structures are exemplified with reference to the drawings. There may be a case where structures are illustrated in different dimensions and scale sizes from those of actual structures in order to show the feature thereof in a way easy to understand. The following embodiments show a case where the invention is applied to an electronic component mounted in a liquid crystal display.

First Embodiment

Figure 1:
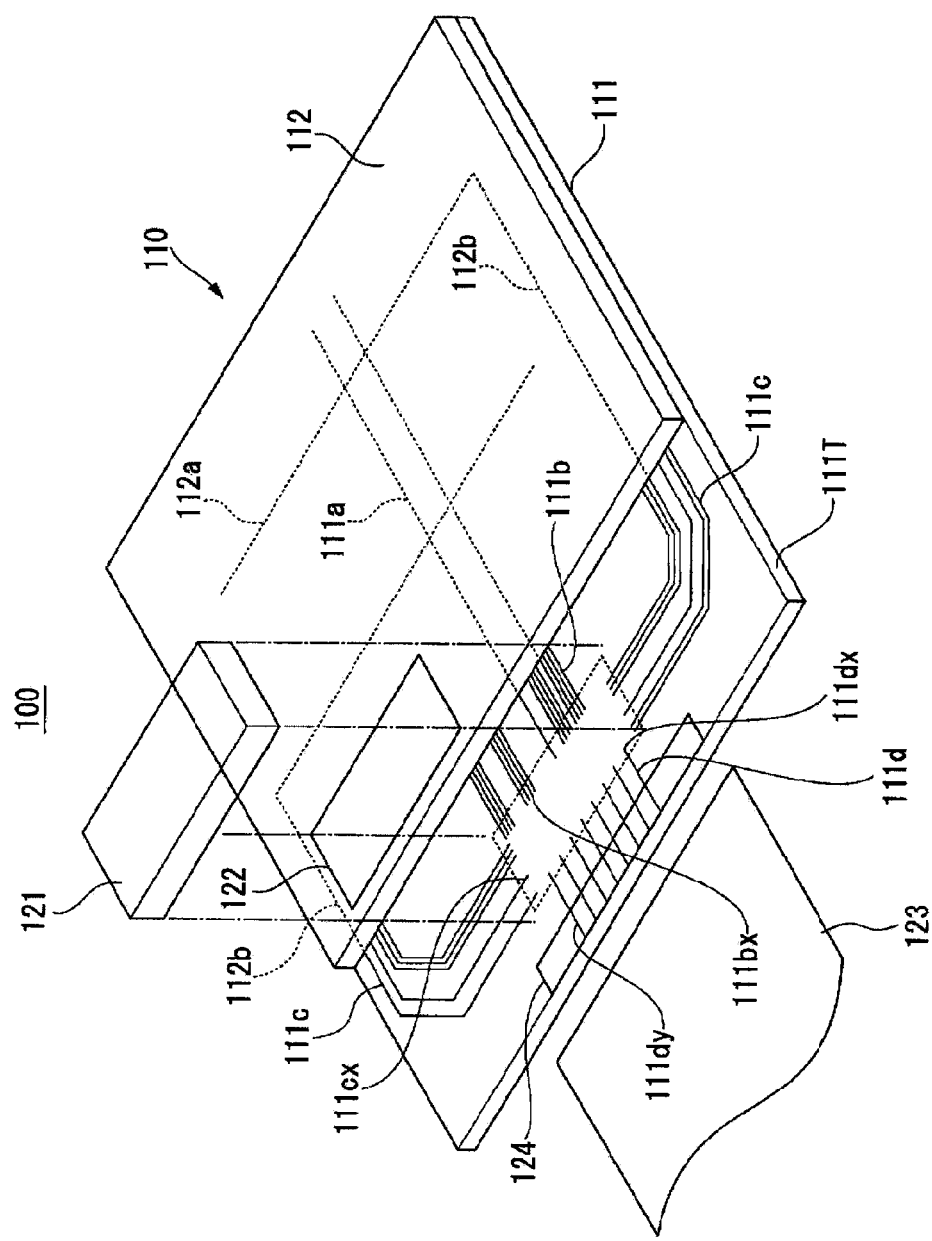
FIG. 1 is a perspective view schematically showing a liquid crystal display in which an electronic component is mounted.

FIG. 1 is a perspective view schematically showing a liquid crystal display in which an electronic component is mounted. A liquid crystal display 100 includes a liquid crystal panel 110 and an electronic component 121. The liquid crystal display 100 includes collateral elements, such as a polarizing plate, a reflection sheet, and a backlight, if necessary. The collateral elements are not shown in FIG. 1.

The liquid crystal panel 110 includes substrates 111 and 112 that are made of glass or a synthetic resin. The substrate 111 and the substrate 112 are disposed to face one another, and are bonded to each other with a sealing member (not shown). In between the substrates 111 and 112, liquid crystal (not shown), which is an electro-optical material, is sealed. On the internal surface of the substrate 111, an electrode 111a made of a transparent conductive material such as indium tin oxide (ITO) is formed. On the internal surface of the substrate 112, an electrode 112a is formed so as to face the electrode 111a.

The electrode 111a connects to a wiring line 111b that is integrally formed with the electrode 111a with the same material. The wiring line 111b extends on a surface (inner surface) of an overhung substrate portion 111T of the substrate 111. The overhung substrate portion 111T is an overhung portion of the substrate 111. The potion is an end portion of the substrate 111 and projected from the outer shape of the substrate 112. On end of the wiring line 111b is a terminal 111bx. The electrode 112a also connects to a wiring line 112b that is integrally formed with the electrode 112a with the same material. The wiring line 112b is electrically connected to a wiring line 111c on the substrate 111 through an up-down electrically connecting portion (not shown). The wiring line 111c is also made of ITO. The wiring line 111c extends on the overhung substrate portion 111T. One end of the wiring 111c is a terminal 111cx. In the vicinity of the end portion of the overhung substrate portion 111T, an input wiring line 111d is formed. One end of the input wiring line 111d is a terminal 111dx. The wiring terminal 111dx is disposed so as to face the terminal 111bx and be in an orthogonal direction with respect to the wiring terminal 111cx. The other end of the input wiring line 111d is an input terminal 111dy.

On the overhung substrate portion 111T, the electronic component 121 of the first embodiment is mounted with a sealing resin 122 of a thermosetting resin interposed therebetween. The electronic component 121 is, for example, a liquid crystal driving IC chip that drives the liquid crystal panel 110. The electronic component 121 has a rectangular solid-like shape. The bottom surface has an active surface with a nearly rectangular shape. On the active surface, a number of external connection terminals and bump electrodes having a conductive film are formed. Each conductive film is electrically connected to one of the external connection terminals. The bump electrodes are electrically connected to the terminals 111bx, 111cx, and 111dx on the overhung substrate portion 111T. In this way, the electronic component 121 is mounted on the substrate 111. Any kind of resin can be used for the sealing resin 122. Preferably, the sealing resin 122 is an epoxy resin, an acrylic resin, or a phenol resin.

In a region in which the input terminal 111dy is disposed on the overhung substrate portion 111T, a flexible wiring substrate 123 is mounted with an anisotropic conductive film 124. The flexible wiring substrate 123 is provided with wiring lines (not shown) corresponding to the input terminal 111dy, so that the wiring lines and the input terminal 111dy are electrically connected. Through the flexible wiring substrate 123, control signals, image signals, power supply potentials and the like are externally supplied to the input terminal 111dy. The control signals, image signals, power supply potentials and the like supplied to the input terminal 111dy are inputted to the electronic component 121, in which a driving signal for driving a liquid crystal is produced so as to be supplied to the liquid crystal panel 110.

The liquid crystal display 100 can independently modulate light every pixel included in a portion formed by the electrodes 111a and 112 a disposed so as to face each other by applying an appropriate voltage between the electrodes 111a and 112a through the electronic component 121. This modulated light can form a desired image in a display region of the liquid crystal panel 110.

Figure 2A:
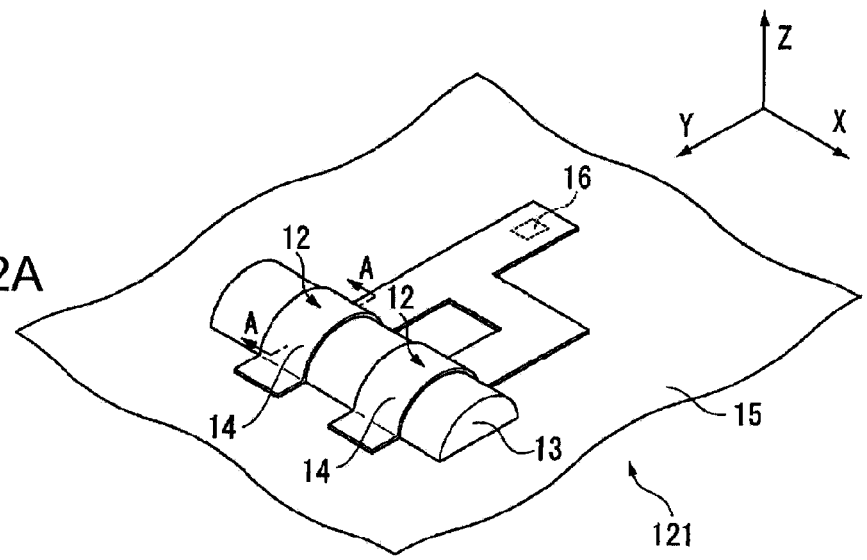
FIG. 2A is a perspective view of an electronic component.
Figure 2B:
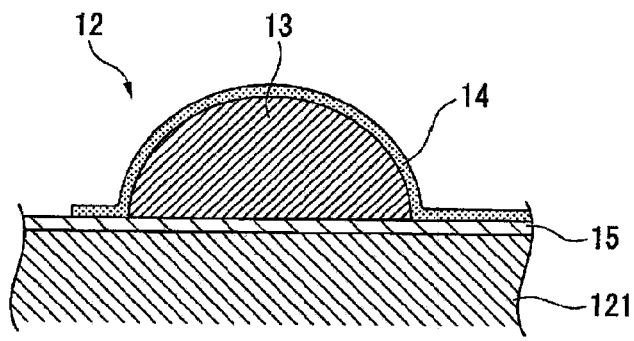
FIG. 2B is a sectional view.
Figure 2C:
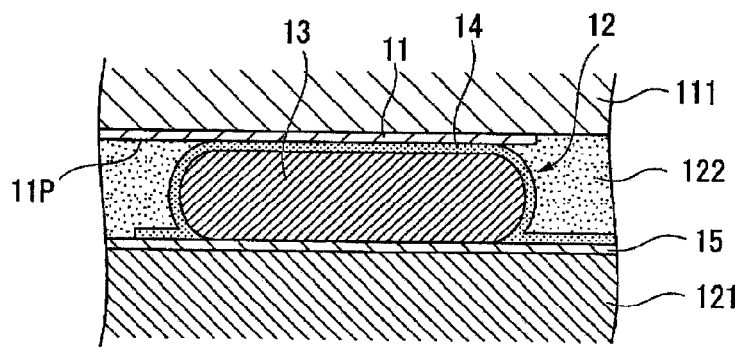
FIG. 2C is a sectional view showing a mounted state.

FIG. 2A is an enlarged perspective view showing one characteristic structure disposed on the active surface of the electronic component 121 before being mounted to the liquid crystal display 100. FIG. 2B is a sectional view taken along the line A-A in FIG. 2A. FIG. 2C is a sectional view showing a mounted state of a part shown in FIG. 2B. In FIG. 2C, a wiring pattern 11P represents any of the wiring lines 111b, 111c, and 111d disposed on the substrate 111, and a terminal 11 represents any of terminals 111bx, 111cx, and 111dx that are respectively provided to the wiring lines 111b, 111c, and 111d. In the embodiment, the end portion of the wiring pattern 11P functions as the terminal 11. Alternatively, a land may be formed as a terminal at the end portion of the wiring pattern 11P so as to be continued from the wiring pattern lip.

The electronic component 121 of the embodiment includes an external connection terminal 16 and a plurality of bump electrodes 12 (in this case, two bump electrodes) electrically connected to the external connection terminal 16, as shown in FIG. 2A. The external connection terminal 16 is provided, for example, in the following manner. A protective film 15 disposed on the surface of the electronic component 121 is partially opened. In the opening, the electrode of an element and/or an electrode wiring line that are included in the electronic component 121 is exposed so as to serve as the external connection terminal 16. Each of the bump electrodes 12 includes an internal resin 13 disposed on the active surface and a conductive film 14 that has a belt-like shape and is disposed on the surface of the internal resin 13.

The internal resin 13 is formed in a nearly half-cylindrical shape with a transverse section having a nearly semicircular shape, a nearly semielliptical shape, or a nearly trapezoidal shape. The transverse section is orthogonal to the active surface. In the embodiment, the transverse section is a nearly semicircular shape with the arc convexed outwardly with respect to the electronic component 121 as shown in FIG. 2B. The internal resin 13 is made of a photosensitive insulation resin or a thermosetting insulation resin. Specifically, the internal resin 13 is formed with a resin, such as a polyimide resin, an acrylic resin, a phenol resin, a silicone resin, a silicone modified polyimide resin, and an epoxy resin. The internal resin 13 made of such resin is formed in the nearly half-cylindrical shape by a known lithographic technique and reflow technique, which are described later. The property of the resin (e.g. hardness), detailed shape (e.g., height and width) of the nearly half-cylindrical shape, and the like are appropriately chosen and designed based on the shape, size, and the like of the terminal 11.

The conductive film 14 has an electrode portion and a wiring portion extending to a side adjacent to the external connection terminal 16 from the electrode portion. Two electrode portions of the conductive films 14 are disposed apart from one another. In the embodiment, the electrode portion and the wiring portion of the conductive film 14 are integrally formed. The wiring portions extending from the two electrode portions are unified at a position between the internal resin 13 and the external connection terminal 16. The unified wiring portion makes directly contact with the external connection terminal 16. In this way, the two electrode portions are electrically connected to the external connection terminal 16, and individually function as a part of the bump electrode 12.

The conductive film 14 is made of metal or alloy such as Au, TiW, Cu, Cr, Ni, Ti, W, NiV, Al, Pd, and lead-free solder. The conductive film 14 may be formed as a single layer of the metal or alloy or a multi-layer of them. The conductive film 14 may be film-formed by a known film forming method such as sputtering and patterned into a belt-like shape. The conductive film 14 may also be selectively formed by electroless plating. The conductive film 14 may also be formed by the following manner: an underlayer film is formed by sputtering or electroless plating; and an upper layer film is formed on the underlayer film by electrolytic plating so as to form the conductive film 14 composed of the two films. The kind of metal (or alloy), layer structures, film thicknesses, widths, and the like are appropriately chosen and designed based on the shape, size, and the like of the terminal 11 likewise the case of the internal resin 13. The conductive film 14 elastically deforms together with the internal resin 13, when being bonded to the terminal 11 as described later. Note that gold (Au) is preferably used as a material for the conductive film 14 since gold has good rolling property. When the conductive film 14 is formed with layered films, it is preferable that gold be used for its outermost layer. As for the width of the conductive film 14, it is preferable that the width be sufficiently larger than that of the terminal 11 to which the conductive film 14 is bonded.

In the structure described as above, the electronic component 121 is pressed to the substrate 111 with the bump electrode 12 corresponding to the terminal 11, thereby the bump electrode 12 convexed toward the substrate 111 is pressed and elastically deformed. As shown in FIG. 2C, the conductive film 14 is pressed to the terminal 11 by an elastic restoring force (repelling force) of the internal resin 13 to be deformed as a nearly flat surface at the contact portion of the bump electrode 12 and the terminal 11. As a result, the conductive film 14 is attached firmly and adequately to the terminal 11 with a firm bonding strength. Then, for example, a sealing resin 122 provided between the electronic component 121 and the substrate 111 is cured so as to fix the electronic component 121 and the substrate 111, maintaining a firmly attached state of the conductive film 14 and the terminal 11. As a result, the conductive film 14 and the terminal 11 are adequately electrically connected. The sealing resin 122 may be provided before or after pressing the electronic component 121 to the substrate 111 prior to the curing of. It is preferable that the resin 122 be provided before pressing the electronic component 121 to the substrate 111. Because the sealing resin 122 can be adequately provided between the electronic component 121 and the substrate 111 prior to the curing of, and the excess amount of the sealing resin 122 is pushed out from sides in pressing them together.

Here, the internal resin 13 can be compressed with a larger deformation volume than that in a case where the internal resin 13 is made of metal since the internal resin 13 is made of a resin. The deformation volume is capable of absorbing the thickness variations of the bump electrode 12 and the terminal 11. The contact failures between the conductive film 14 and the terminal 11 due to the thickness variations can be prevented. As a result, the bump electrode 12 and the terminal have high contact reliability.

Since the internal resin 13 is formed in the nearly half-cylindrical shape, the deformation volume is uniform in its extending direction (in the longitudinal direction) when being pressed. Therefore, the deformation volume of the conductive film 14 disposed on the surface of the internal resin 13 is uniform in the extending direction of the internal resin 13, thereby making it unlikely to concentrate stresses to the conductive film 14. As a result, the conductive film 14 can be prevented from being broken due to stress concentration, thereby improving the connection reliability. Since the shape of the internal resin 13, i.e., the shape of the bump electrode 12, is the nearly half-cylindrical shape, the bump electrode 12 deformed by the pressing has a contact surface with respect to the terminal 11, the contact surface having a nearly rectangular shape. This contact surface has a larger area than that in an exemplary case where the internal resin has a semispherical shape and its contact surface has a circular shape. As a result, contact failures due to the alignment shift between the terminal 11 and the bump electrode 12 can be prevented, thereby improving the connection reliability.

This structure including a plurality of (in this case, two) bump electrodes 12 and the external connection terminal 16 electrically connected to the electrodes 12 can reduce wiring inside an electronic component or in a substrate to which the electronic component is mounted.

For example, when one element inside the electronic component corresponds to two terminals of the substrate, wiring lines are typically provided inside the electronic component or in the substrate to bifurcate. In the invention, the electrode wiring line (electrode) of one element corresponds to one external connection terminal 16, and the external connection terminal 16 can correspond to two bump electrodes 12 on the active surface. Therefore, either one of the following two manners is not necessary inside the electronic component: providing wiring to make branched electrode wiring lines; and providing wiring to connect the two branched electrode wiring lines to the external connection terminal.

The electronic component of the invention has extremely high connection reliability and a high degree of freedom in design. Consequently, downsizing and characteristic improvement of an electronic component and highly integrated elements in the electronic component can be achieved.

In general, if it is intended to downsize an electronic component or to highly integrate elements in the electronic component, wiring lines inside the electro component need to be finely fabricated, resulting in high wiring resistance. However, the invention can downsize the electronic component and highly integrate the elements because a part of wiring lines inside the electronic component can be omitted by functioning the wiring line (a part of the conductive film 14) between the bump electrode 12 and the external connection terminal 16 as a re-wired wiring line replacing the omitted one. In addition, since the conductive film 14 is formed on the surface of the electronic component, the film 14 has a high degree in selecting materials and forming methods thereof. For example, a thick conductive film made of gold can be formed by a plating method. This thick conductive film has lower resistance and lower high-frequency loss than those of finely fabricated wiring lines inside the electronic component. As a result, the characteristics of the electronic component can be improved.

Further, the distance between wiring lines in the substrate can be widened as compared with a case where branched wiring lines are formed in the substrate to which the electronic component is mounted. As a result, a low cost substrate can be provided and the electronic component can be mounted with low costs.

Modifications

In the first embodiment, an example is described in which two bump electrodes 12 disposed on the internal resin 13 are connected to the external connection terminal 16. The number of internal resins 13 and bump electrodes 12, their arrangement, and the disposition of the external connection terminal 16 can be modified in various ways. Some modifications are described below.

FIGS. 3A to 3D are perspective views showing modifications of the first embodiment.

Figure 3A:
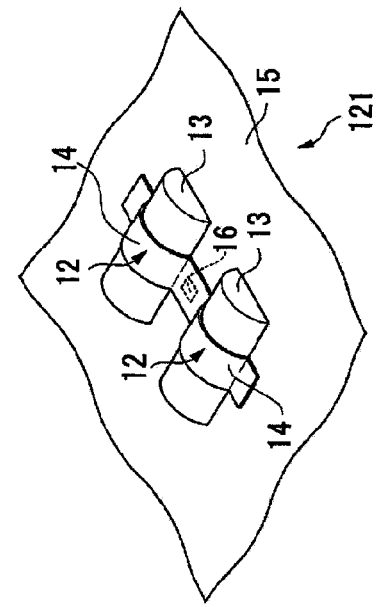
FIGS. 3A to 3D are perspective views showing modifications.

A first modification shown in FIG. 3A differs from the first embodiment in that three bump electrodes 12 are connected to the external connection terminal 16. In the modification, each conductive film 14 has an electrode portion disposed on the surface of the internal resin 13 and spaced apart from one another. Thus, three electrode portions are provided. Each conductive film 14 extends from the electrode portion thereof to one side of the internal resin 13 along its extending direction (a side adjacent to the external connection terminal 16). The conductive film 14 between the surface of the internal resin 13 and the external connection terminal 16 serves as a wiring portion functioning as a wiring line. The three wiring portions extending from the three electrode portions are unified at a position between the surface of the internal resin 13 and the external connection terminal 16. The unified wiring portion makes directly contact with the external connection terminal 16. That is, the conductive film 14 of the bump electrode 12 is integrally formed with its wiring portion. Thus, each of the three electrode portions individually functions as a part of the bump electrode 12. The number of bump electrodes 12 connected to the external connection terminal 16 may be three as shown in this case, or may be four or more.

Figure 3B:
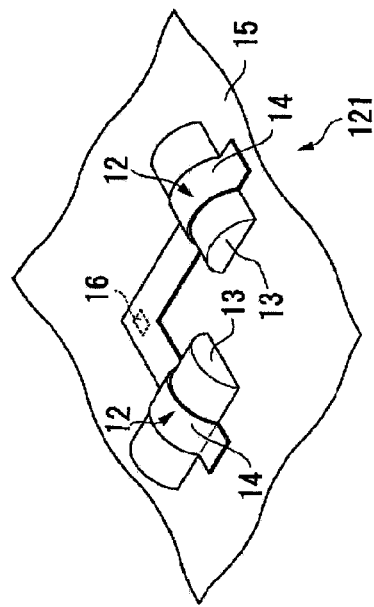

A second modification shown in FIG. 3B differs from the first embodiment in that two bump electrodes 12 are connected to the external connection terminal 16 and the two bump electrodes 12 are disposed on the internal resins 13 independent from one another. In the second modification, two internal resins 13 extend in parallel from one another. The external connection terminal 16 is provided between the two internal resins 13. The conductive film 14 has electrode portions disposed on the surfaces of the internal resins 13 and a wiring portion that is disposed between the internal resins 13 and connects the electrode portions. The wiring portion is directly contacted and electrically connected to the external connection terminal 16 between the internal resins 13. Each bump electrode 12 is composed of the internal resin 13 and the electrode portion (conductive film 14) on the surface of the internal resin 13. In this way, a plurality of the bump electrode 12 may be connected to the external connection terminal 16 and the bump electrodes 12 may be disposed on the internal resins 13 independent from one another. In addition, a plurality of the bump electrodes 12 disposed on one internal resin, i.e., as shown in the first embodiment, and a bump electrode disposed on another internal resin different from the one internal resin may be connected to one external connection terminal.

Figure 3C:
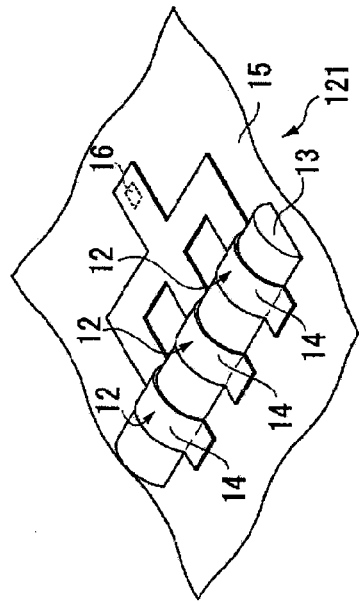

A third modification shown in FIG. 3C differs from the second modification in that the external connection terminal 16 is provided outside the two internal resins 13 that extend in parallel from one another. The conductive film 14 has electrode portions disposed on the surfaces of the internal resins 13, a connection portion provided between the internal resins 13 and a wiring portion that extends from the surface of the internal resin 13 disposed at a side adjacent to the external connection terminal 16 to the external connection terminal 16. In this way, the electrode portion (conductive film 14) of the bump electrode 12 may be electrically connected to the external connection terminal 16 with another bump electrode 12 interposed therebetween.

Figure 3D:
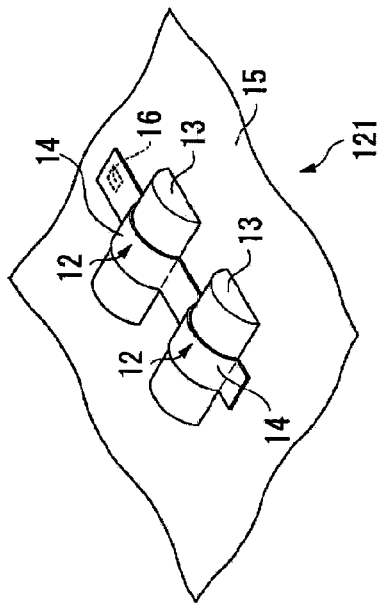

A fourth modification shown in FIG. 3D differs from the second modification in that the two internal resins 13 are independent and extend in different directions from one another. In the fourth modification, the internal resins 13 extend so as to be mutually orthogonal. The conductive film 14 has electrode portions disposed on the surfaces of the internal resins 13 and a wiring portion that extends from each electrode portion so as to be orthogonal to the extending direction of the internal resin 13 and forms a nearly L-shape. In the modification, the external connection terminal 16 is provided at a position, at which extending portions from the electrode portions are intersected, i.e., at a corner of the wiring portion. In addition, more than one internal resin 13 may extend in different directions from each other. For example, two internal reins 13 may extend in parallel one another and another internal resin 13 may extend in a direction different from the extending direction of the two internal resins 13.

Second Embodiment

Next, a second embodiment of the electronic component of the invention is described. The second embodiment differs from the first embodiment in that the electronic component has a bump electrode that is electrically connected to more than one external connection terminal.

Figure 4A:
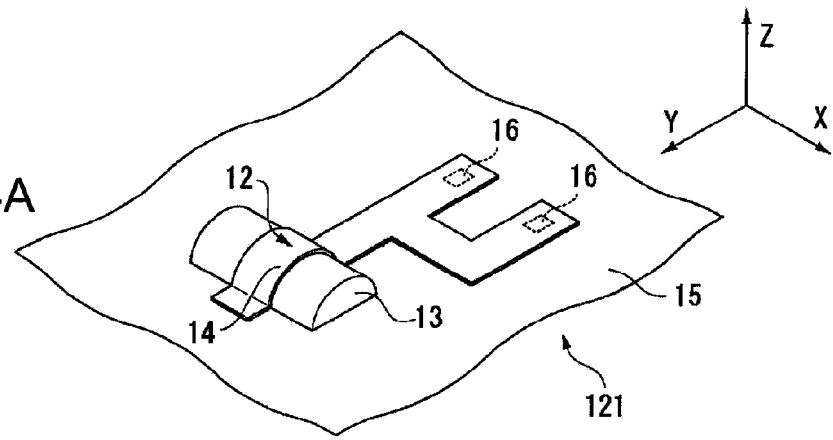
FIG. 4A is a perspective view of an electronic component.

FIG. 4A is an enlarged perspective view showing one characteristic structure disposed on the active surface of the electronic component 121 before being mounted to the liquid crystal display 100. The electronic component 121 of the second embodiment includes a plurality of the external connection terminals 16 (in this case, two external connection terminals) and the bump electrode 12 electrically connected to the external connection terminals 16, as shown in FIG. 4A. The bump electrode 12 includes the internal resin 13 disposed on the active surface and the conductive film 14 that has a belt-like shape and is disposed on the surface of the internal resin 13. The internal resin 13 is formed in the nearly half-cylindrical shape in the same manner of the first embodiment.

The conductive film 14 of the second embodiment has an electrode portion disposed on the surface of the internal resin 13 and a wiring portion extending to a side adjacent to the external connection terminals 16 from the electrode portion. In the embodiment, the electrode portion and the wiring portion are integrally formed. The wiring portion extending from the electrode portion is divided into two portions at a position between the internal resin 13 and the external connection terminals 16. Each of the divided wiring portions makes directly contact with one of the external connection terminals 16. That is, the electrode portion is electrically connected to the two external connection terminals 16, and functions as a part of the bump electrode 12.

The materials and forming methods described in the first embodiment for the electrode 14 can also be used as those for the conductive film 14 in the second embodiment.

The electronic component 121 of the second embodiment can be mounted to the substrate 111 in the same manner of the electronic component 121 of the first embodiment (refer to FIG. 2C) and have extremely high connection reliability between the bump electrode 12 and the terminal 11 in the mounting. This structure including the bump electrode 12 electrically connected to the plurality of (in this case, two) the external connection terminals 16 can reduce wiring inside an electronic component or in a substrate to which the electronic component is mounted. That is, the electronic component 121 of the first embodiment does not need providing wiring to make branched electrode wiring lines inside the electronic component and the substrate since the external connection terminal 16 is divided on the active surface. On the other hand, the second embodiment does not need providing wiring to unify wiring lines inside the electronic component or the substrate since the external connection wiring lines are unified on the active surface. Consequently, a degree of freedom in designing an electronic component is increased, thereby making it possible to downsize and improve the characteristics of the electronic component and highly integrate elements in the electronic component. Further, the distance between wiring lines in the substrate can be widened as compared with a case where the wiring lines are unified in the substrate to which the electronic component is mounted. As a result, a low cost substrate can be provided and the electronic component can be mounted with low costs.

Modifications

In the second embodiment, an example is described in which the bump electrode 12 disposed on the internal resin 13 is connected to the two external connection terminals 16. The number of the external connection terminals 16 and the disposition thereof can be modified in various ways. Some modifications are described below.

Figure 4B:
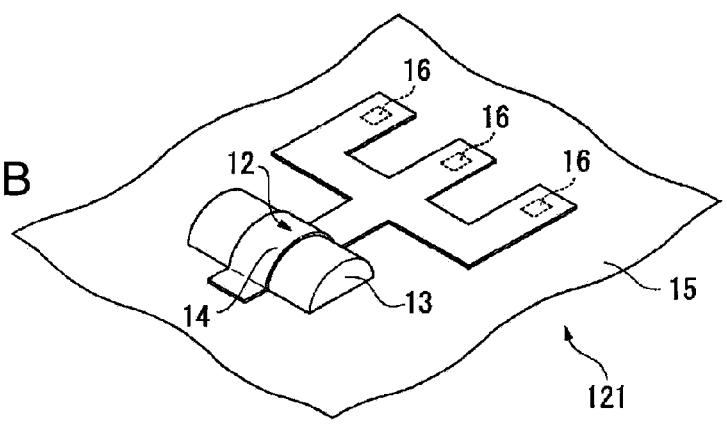
FIGS. 4B and 4C are perspective views showing modifications.
Figure 4C:
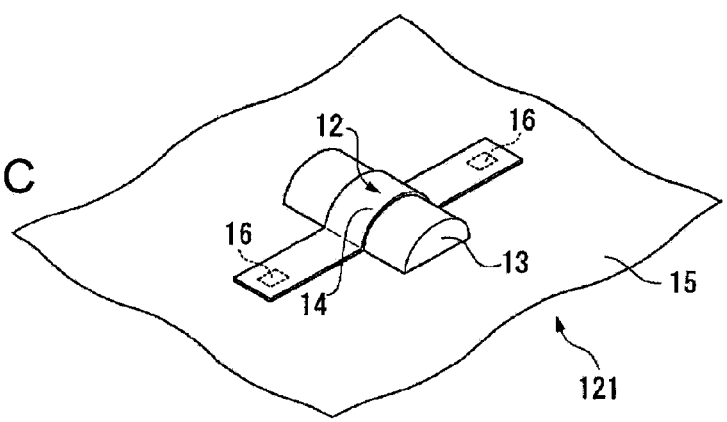

FIGS. 4B and 4C are perspective views showing modifications of the second embodiment.

A fifth modification shown in FIG. 4B differs from the second embodiment in that three external connection terminals 12 are connected to the bump electrode 12. The conductive film 14 of the fifth modification has an electrode portion disposed on the surface of the internal resin 13 and a wiring portion extending from the electrode portion to one side of the internal resin 13 along its extending direction (a side adjacent to the external connection terminals 16). The wiring portion is divided into three portions at a position between the internal resin 13 and the external connection terminals 16. Each of the divided wiring portions makes directly contact with one of the external connection terminals 16. That is, the conductive film 14 of the bump electrode 12 is integrally formed with its wiring portion. Thus, the three external connection terminals 16 function as a part of the bump electrode 12. The number of external connection terminals 16 connected to the bump electrode 12 may be three or may be four or more.

A sixth modification shown in FIG. 4C differs from the fifth modification in that the two external connection terminals 16 are provided across the internal resin 13 along the extending direction of the internal resin 13. The conductive film 14 of the six modification has an electrode portion disposed on the surface of the internal resin 13 and wiring portions extending from the electrode portion to both sides adjacent to the external connection terminals 16. Each of wiring portions extending to either one of the both sides is directly connected to one of the external connection terminals 16. In addition, a plurality of the external connection terminals 16 may be electrically connected through the bump electrode 12 disposed between the external connection terminals 16. Further, the wiring portion at a one side or at both sides along the extending direction of the internal resin 13 may be divided so that the bump electrode is electrically connected to more than two external connection terminals.

Specific Example

A specific example of an electronic component including structures described in the first and second embodiments, and the first to the sixth modifications is described.

Figure 5:
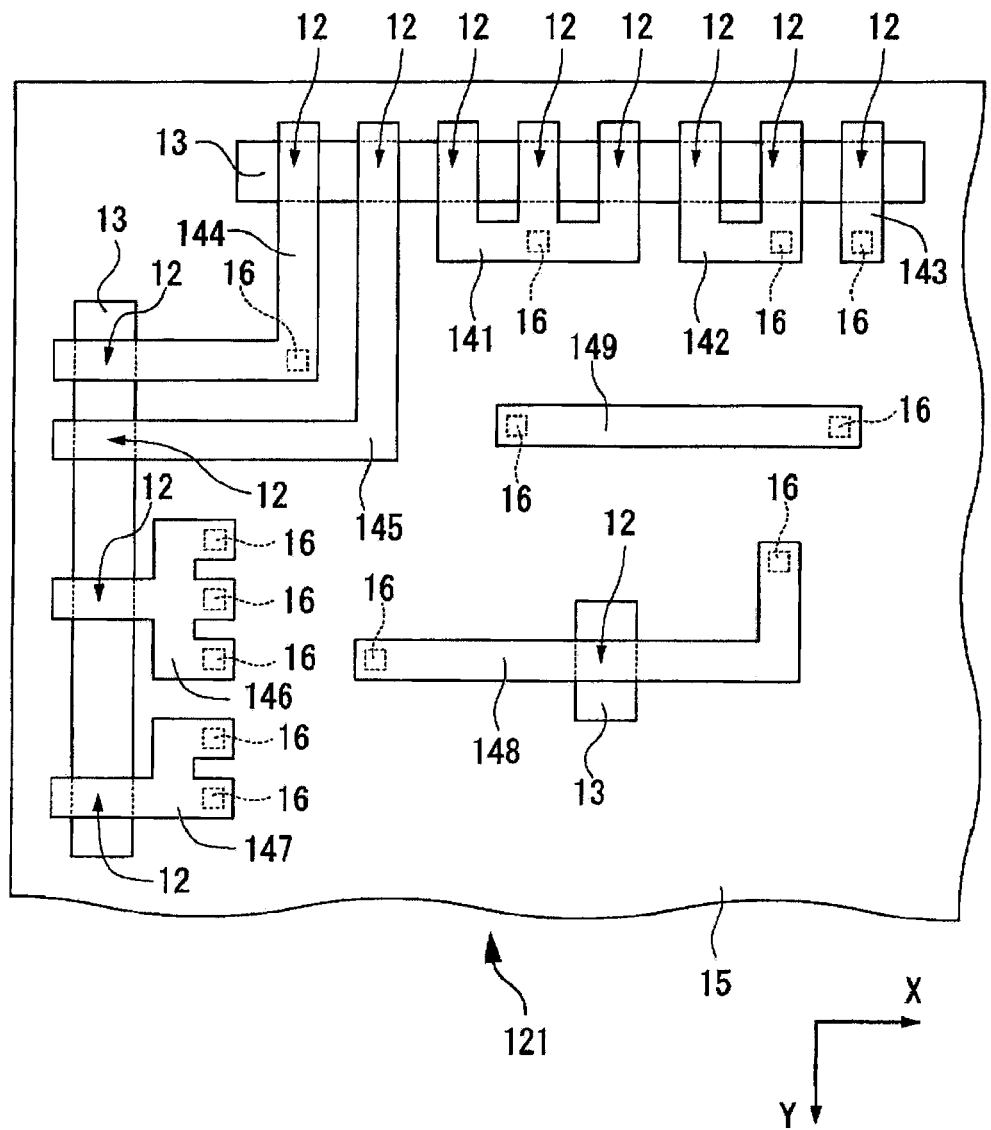
FIG. 5 is a plan view showing a specific example.

FIG. 5 is a plan view schematically showing the arrangement of the bump electrodes 12 and the external connection terminals 16 that are disposed on the active surface of the electronic component 121.

The active surface of the electronic component 121 has a nearly rectangular shape. The long side of the nearly rectangular shape is defined as the X direction while the short side is defined as the Y direction. On the active surface, a plurality of the external connection terminals 16 is disposed. Conductive films 141, 142, 143, 144, 146, 147, and 148, and a global wiring line 149 are disposed so as to electrically connected to the external connection terminals 16.

The conductive film 141 directly makes contact with the external connection terminal 16 and is divided into three portions and the divided portions extend in a nearly Y direction. Each of the divided portions intersects the internal resin 13 at right angles, the internal resin 13 being provided at a side closer to the edge of the active surface than the external connection terminal 16 and extending in the X direction. These three intersected portions individually function as the bump electrode 12. The conductive film 142 provided in the X direction with respect to the conductive film 141 is divided into two portions from the external connection terminal 16 and divided portions extend in nearly the Y direction, thereby intersecting the internal resin 13, which the conductive film 141 intersects, at right angles at two places. These intersected portions also individually function as the bump electrode 12. The conductive film 143 provided in the X direction with respect to the conductive film 142 extends in the Y direction without being divided. The conductive film 143 intersects the internal resin 13, which the conductive films 141 and 142 intersect. This intersected portion functions as the bump electrode 12. In this way, the electronic component 121 includes three structures together, in which one bump electrode 12 is electrically connected to the external connection terminal 16, two bump electrodes 12 are electrically connected to the external connection terminal 16, and three bump electrodes 12 are electrically connected to the external connection terminal 16.

The conductive films 144 and 145 are provided at a side adjacent to an edge of the active surface in the X direction with respect to the conductive film 141. The conductive films 144 and 145 have a nearly L-shape so that they intersect the internal resin 13, which the conductive film 141 intersects, at right angles, and also the internal resin 13 extending in the Y direction in a periphery along the Y direction of the active surface at right angles. The conductive film 144 directly makes contact with the external connection terminal 16 at the corner of the conductive film 144. The two portions, each intersected at right angles with respect to the internal resin 13, of the conductive film 144 function as the bump electrode 12.

A conductive film 145 is not electrically connected to the external connection terminal 16. The two portions, each intersected at right angles with respect to the internal resin 13, of the conductive film 145 function as the bump electrode 12. The bump electrodes 12 are contacted and electrically connected to the terminal 11 (refer to FIG. 2C) in a mounting step. That is, the conductive film 145 functions as a cross wiring line of the terminal 11.

The conductive films 146 and 147 are provided in the Y direction with respect to the conductive film 145. The conductive film 146 intersects the internal resin 13 extending in the Y direction at right angles and is divided into three portions, and the divided portions extend in nearly the X direction. Each of the divided portions directly makes contact with one of the external connection terminals 16. The portion, intersected at right angles with respect to the internal resin 13, of the conductive film 146 functions as the bump electrode 12. The conductive film 147 intersects the internal resin 13, which the conductive film 146 intersects, at right angles and is divided into two portions, and the divided portions extend in nearly the X direction. Each of the divided portions directly makes contact with one of the two external connection terminals 16. The portion, intersected at right angles with respect to the internal resin 13, of the conductive film 147 also functions as the bump electrode 12. In this way, the electronic component 121 includes two structures together, in which the bump electrode 12 is electrically connected to the two external connection terminals 16 and the bump electrode 12 is electrically connected to the three external connection terminals 16.

In this example, a plurality of the external connection terminals 16 (in this case, two) is also provided at a side adjacent to the central portion of the active surface. A conductive film 148 is provided that directly makes contact with the external connection terminals 19 and extends between the external connection terminals 19 in nearly the X direction. The conductive film 148 intersects over (at right angles) the internal resin 13 provided at a side adjacent to the central portion of the active surface and extends between the external connection terminals 16. The portion intersected at right angles with respect to the internal resin 13 also functions as the bump electrode 12.

A global wiring line 149 is also provided on the active surface. The global wiring line functions so as to electrically connect more than one external connection terminals. The global wiring line 149 is provided between the two external connection terminals 16 and electrically connects the external connection terminals 16 without the bump electrode. The global wiring line 149 may connect more than two external connection terminals. The global wiring line 149 has a feature that it has lower resistivity than that of aluminum used for internal wiring lines of an electronic component and can be designed to have a wide pattern width. Thus, the global wiring line 149 can provide an adequate wiring pattern for wiring lines requiring low wiring impedance such as power supply lines and grounded lines. The global wiring line provided on the surface (active surface) of an electronic component instead of wiring lines inside the electronic component can reduce one layer of wiring layers inside the electronic component. As a result, photomasks and processes necessary for forming wiring lines also can be reduced.

In addition, the global wiring line 149 having an extremely wide width (not shown) allows a design that the global wiring line 149 covers the entire surface of an electronic component or a whole necessary portion. In this case, the wiring impedance of the power supply lines and grounded lines can be decreased as low as possible and a function of a shield covering the surface of the electronic component can be provided. This design can provide a structure that reduces noise outputs and is robust against external noises, and also a shielding structure for a structure in which device characteristics are fluctuated by light, such as transistors fabricated in the electronic component. When terminals contacted and electrically connected to the bump electrodes 12 having the conductive films 146 and 147 are not provided in a mounting step, the conductive films 146 and 147 can also function as a global wiring line between the external connection terminals 16.

The conductive films 141 to 148 and the global wiring line 149 can be formed as a whole by the following exemplary manner: a conductive material is film-formed by sputtering or vacuum deposition; and then the film is patterned by photolithography and etching. In this case, the conductive film 145 functioning as a cross wiring line and the global wiring line 149 are also formed. As a result, wiring inside an electronic component and of a substrate to which the electronic component is mounted can be simplified without increasing process costs.

Manufacturing Method

An example of a forming method of the bump electrode 12 serving as a major part of the electronic component of the invention is described as an example of manufacturing method of the electronic component.

Figure 6A:
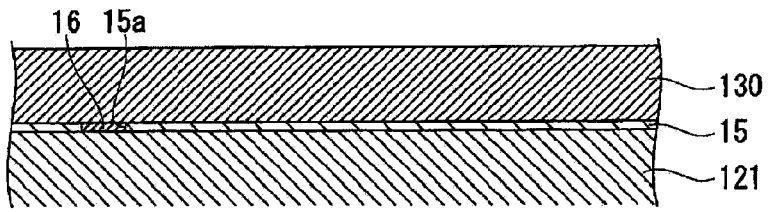
FIGS. 6A to 6D are sectional step views showing a method for forming a bump electrode.

First, as shown in FIG. 6A, a resin for forming the internal resin 13 is coated on the active surface of the electronic component 121 with a thickness of about 10 to 20 μm, for example. Examples of the resin for forming the internal resin 13 include a polyimide resin serving as a negative resist. Here, in advance of the coating, a protective film 15 made of an insulation material is formed on the active surface of the electronic component 121, and an opening 15*a* is formed to the protective film 15 so that the external connection terminal 16 appears inside the opening 15*a*. Then the coated resin is pre-baked so as to form a resin layer 130.

Figure 6B:
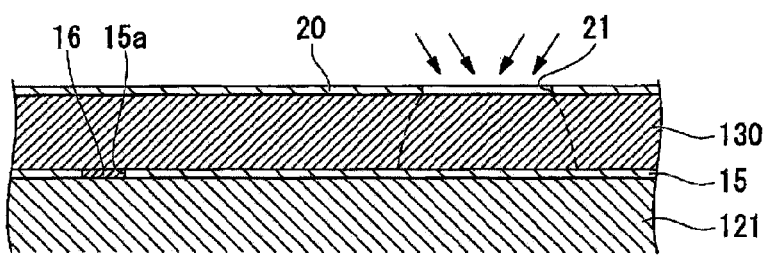
Figure 6C:
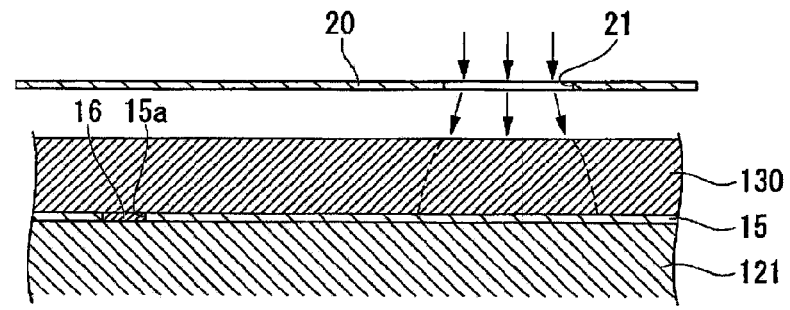

Next, as shown in FIG. 6B, a photomask 20 is aligned at a predetermined position on the resin layer 130 and set at the position. The photomask 20 is a glass substrate, for example. The glass plate has a light shielding film of such as Cr, and a rectangular opening 21 correspondingly to the planar shape of the internal resin 13 having the nearly half-cylindrical shape. The photomask 20 is aligned so that the opening 21 is positioned at a place of forming the internal rein 13. In FIGS. 6B and 6C, the photomask 20 shows only the light shielding film without the glass plate.

Next, the photomask 20 is irradiated with exposure light so as to expose the resin layer 130 inside the opening 21. In the exposure step, exposure conditions are controlled so that a pattern of the resin layer 130 obtained after development is formed in the nearly half-cylindrical shape having a transverse section (main section) of a nearly semicircular shape (or a nearly semielliptical shape).

Specifically, exposure light is obliquely irradiated as indicated with arrows in FIG. 6B so that the exposed portion of the resin layer 130 shows a transverse section having a nearly semicircular shape (nearly trapezoidal shape) as indicated with dashed lines in FIG. 6B. As shown in FIG. 6C, the resin layer 130 may be subjected to an off-contact exposure so that the exposed portion shows a transverse section having the nearly semicircular shape (nearly trapezoidal shape) as indicated with dashed lines in FIG. 6C. In the off-contact exposure, the photomask 20 is set apart from the resin layer 130. As another manner, the exposed portion may have the transverse section having the nearly semicircular shape (nearly trapezoidal shape) by using the photomask 20 of a semi-transmissive mask or a half-tone mask. The half-tone mask has a semi-transmissive property in a portion around the opening 21 and the lower the semi-transmissive property the further off the opening 21. The region having a semi-transmissive property formed in the mask allows the outer side i.e., the side surface portion of the nearly semicircular shape (nearly trapezoidal shape) to be exposed.

In this exposure, the resin layer 130 just below the opening 21 of the mask 20 is entirely exposed in the thickness direction. In a portion around the opening 21, the lower the exposed amount the further off the opening 21. An unexposed portion of the resin 130 is developed by development after the exposure and removed. In contrast, the portion just under the opening 21, i.e., the exposed portion, remains without being developed.

In the portion around the opening 21, the resin layer 130 remains according to the exposed amount, i.e., the bottom side of the resin layer 130 remains. As a result, as show in FIG. 6D, a resin pattern 130a is formed in the nearly half-cylindrical shape with the transverse section having the nearly trapezoidal shape.

Figure 6D:
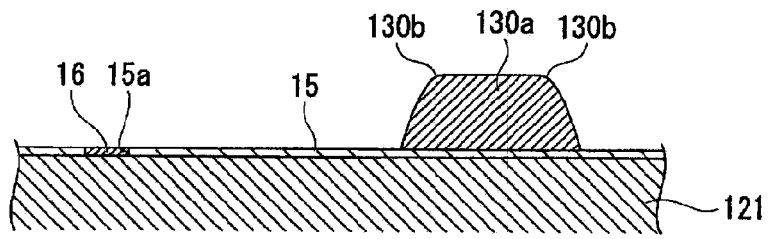

The shape of the resin pattern 130a can be controlled to some extent with exposure conditions and development conditions. Therefore, as shown in FIG. 6D, a shoulder portion 130b of the resin pattern 130a can be curved to some extent by controlling the region having a semi-transmissive property of the mask. However, in order to form the whole exposed surface to a curved shape by curving the shoulder portion 130 more gently and further curving the side and upper portions, a reflow treatment is preferable.

Figure 7A:
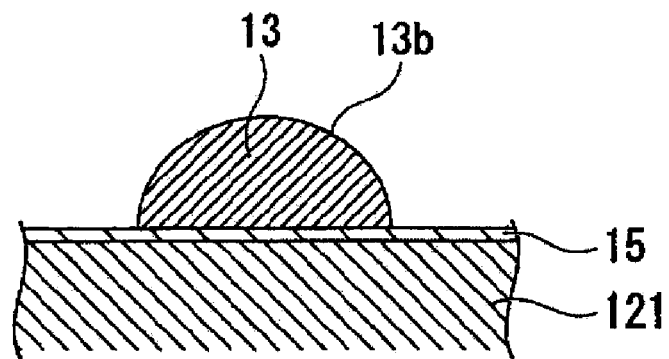
FIGS. 7A and 7B are sectional step views showing a method for forming the bump electrode.

The reflow treatment is carried out according to the material of the resin pattern 130a by heating the resin pattern 130a to a temperature at which the resin is softened and the surface is melted. After the resin pattern 130a is heated and melted, at normal temperature, the internal resin 13 is formed that has the main section with the nearly semicircular shape as shown in FIG. 7A. That is, the surface of the resin pattern 130a is soften and melted in the reflow treatment and turns to a continuous curved surface wholly smoothly curved. As for the transverse section (main section) formed in the nearly semicircular shape (nearly trapezoidal shape), an outer side 13b shows entirely continuously smooth curved line, i.e., a shape more similar to a semicircle. This is because that when the resin is softened and the surface is melted, the both sides (shoulder portions) of the outer side 13b droop under their own weights so as to be a shape more similar to a semicircle as shown in FIG. 7A.

Figure 7B:
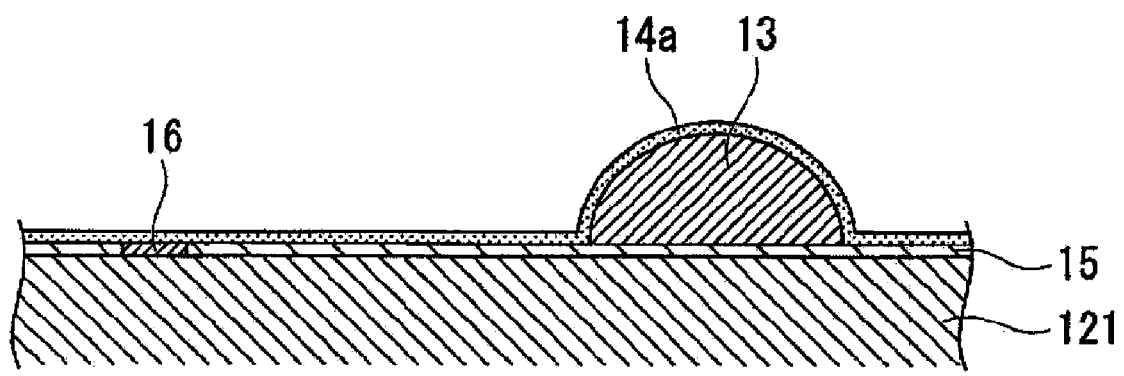

After the internal resin 13 is formed, metal (alloy) such as gold (Au) is deposited on the entire surface of the substrate 111 with an appropriate thickness by sputtering or the like so as to form a conductive layer 14a as shown in FIG. 7B.

Then, a resist pattern (not shown) is formed on the conductive layer 14a by a known resist technique and lithography. With the resist pattern as a mask, the conductive layer 14a is etched so as to form the conductive film 14 having a predetermined pattern as shown in FIG. 3A. Any etching method can be employed. For example, dry etching with plasma and wet etching with chemicals can be used.

Then, the resist pattern is removed to achieve the bump electrode 12.

The internal resin 13 is formed to have the transverse section (main section) with the nearly semicircular shape (nearly trapezoidal shape) by combination of a half-exposure in which exposure amount to the resin layer 130 is controlled and the reflow treatment on the resin pattern 130a after being developed. The desired shape may be formed only by the half-exposure or only by the reflow treatment.

What is claimed is:

1. An electronic component, comprising:
   an active surface;
   a plurality of external connection terminals included in the active surface;
   a plurality of bump electrodes disposed on edges of the active surface, the bump electrodes each including:
      an internal resin formed on the active surface as a core; and
      a conductive film on a surface of the internal resin, at least one of the external connection terminals being electrically connected to the conductive film, and the internal resin being formed in a nearly half-cylindrical shape having a transverse section of one of a nearly semicircular shape, a nearly semielliptical shape, or a nearly trapezoidal shape and extending orthogonal to the transverse section, the transverse section being orthogonal to the active surface; and
   a global wiring line disposed on the active surface inboard from the edges of the active surface and inboard from the bump electrodes, and connecting between at least a pair of the plurality of external connection terminals without use of the bump electrodes.

2. The electronic component according to claim 1, the bump electrode disposed to the active surface including a first bump electrode and a second bump electrode, the internal resin including a first internal resin and a second internal resin, the first bump electrode having the first internal resin extending along a first direction and the second bump electrode having the second internal resin extending along a second direction different from the first direction.

3. The electronic component according to claim 1, the conductive film of the bump electrode extending to a side adjacent to one of the plurality of external connection terminals and directly making contact with and electrically connecting to the one of the external connection terminals, and the one of the external connection terminals corresponding to the bump electrode.

4. The electronic component according to claim 1, the conductive film of the bump electrode being made of gold.

* * * * *